(12) United States Patent
Lee et al.

(10) Patent No.: US 8,349,690 B2
(45) Date of Patent: Jan. 8, 2013

(54) SEMICONDUCTOR DEVICE WITH ONE-SIDE-CONTACT AND METHOD FOR FABRICATING THE SAME

(75) Inventors: Jin-Ku Lee, Gyeonggi-do (KR); Young-Ho Lee, Gyeonggi-do (KR); Mi-Ri Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 125 days.

(21) Appl. No.: 12/649,999

(22) Filed: Dec. 30, 2009

(65) Prior Publication Data

US 2011/0073940 A1    Mar. 31, 2011

(30) Foreign Application Priority Data

Sep. 30, 2009 (KR) .................. 10-2009-0093500

(51) Int. Cl.
*H01L 21/336* (2006.01)
(52) U.S. Cl. ............... 438/270; 438/192; 257/E29.262; 257/E21.41
(58) Field of Classification Search .......... 438/186, 438/192, 195, 270; 257/332, E29.262, E21.41
See application file for complete search history.

(56) References Cited

U.S. PATENT DOCUMENTS

| 6,667,504 | B1 * | 12/2003 | Beintner et al. ............. 257/302 |
| 7,838,925 | B2 * | 11/2010 | Roesner et al. ............. 257/328 |
| 2002/0066925 | A1 | 6/2002 | Gruening et al. | |
| 2007/0032074 | A1 * | 2/2007 | Kwak et al. .................. 438/655 |

FOREIGN PATENT DOCUMENTS

| KR | 1020010104378 | 11/2001 |
| KR | 100665852 | 1/2007 |

OTHER PUBLICATIONS

Office Action issued by the Korean Intellectual Property Office on Oct. 20, 2011.
Notice of Allowance issued by the Korean Intellectual Property Office on May 17, 2012.

* cited by examiner

*Primary Examiner* — Matthew Landau
*Assistant Examiner* — Colleen E Snow
(74) *Attorney, Agent, or Firm* — IP & T Group LLP

(57) ABSTRACT

A method for fabricating a semiconductor device includes forming a first conductive layer doped with an impurity for forming a cell junction over a semiconductor substrate, forming a second layer over the first conductive layer, forming a plurality of active regions by etching the second layer and the first conductive layer, the plurality of the active regions being separated from one another by trenches, forming a side contact connected to a sidewall of the first conductive layer, and forming a plurality of metal bit lines each connected to the side contact and filling a portion of each trench.

9 Claims, 22 Drawing Sheets

SEMICONDUCTOR DEVICE WITH ONE-SIDE-CONTACT AND METHOD FOR FABRICATING THE SAME

CROSS-REFERENCE TO RELATED APPLICATIONS

The present application claims priority of Korean Patent Application No. 10-2009-0093500, filed on Sep. 30, 2009, which is incorporated herein by reference in its entirety.

BACKGROUND OF THE INVENTION

Exemplary embodiments of the present invention relate to a method for fabricating a semiconductor device, and more particularly, to a semiconductor device including a one-side-contact, and a method for fabricating the semiconductor device.

As miniaturization of semiconductor devices continues and 30 nm or 20 nm process are being developed, conventional technologies are reaching their limits. To overcome such difficulty, further increases in die utilization with processes under $4F^2$ is being sought by using a vertical gate (VG) and buried bit line (BBL).

FIG. 1 is a cross-sectional view of a conventional semiconductor device. Referring to FIG. 1, a plurality of pillar structures each include an active pillar 12, a hard mask layer 13 extended perpendicularly to a substrate 11, a gate insulation layer 14 and a vertical gate 15 surrounding the external walls of the active pillar 12. The substrate 11 includes buried bit lines 16 formed therein by performing an ion implantation process with an impurity. Neighboring buried bit lines 16 are separated from one another by trenches 17, and the trenches 17 are filled with an interlayer dielectric layer 18.

According to the prior art shown in FIG. 1, the buried bit lines 16 each buried at the lower portion of the vertical gate 15 are formed by implanting a dopant through an ion implantation process.

However, the buried bit lines 16 formed using such a conventional technology have a high resistance and thus the operation speed may decrease. Also, the conventional technology requires the formation of the trenches 17 for separating neighboring buried bit lines 16 from one another so that cells become larger in order to accommodate the trench formation. However, such an increase in cell sizes is less desirable for high integration.

SUMMARY OF THE INVENTION

An embodiment of the present invention is directed to a semiconductor device that can have buried bit lines with decreased resistance, and a method for fabricating the semiconductor device.

Another embodiment of the present invention is directed to a semiconductor device that can have a cell junction for contacting a buried bit line to be formed at a desired position, and control doping depth and dose, and a method for fabricating the semiconductor device.

In accordance with an embodiment of the present invention, a semiconductor device includes: a plurality of active regions each configured to have a conductive layer pattern doped with an impurity for forming a cell junction, the plurality of the active regions being separated from one another by trenches; a side contact configured to be connected to a sidewall of the conductive layer pattern of the active region; and metal bit lines, each configured to be connected to the side contact and fill a portion of each trench.

In accordance with another embodiment of the present invention, a semiconductor device includes: a plurality of active regions, each configured to have a first sidewall and a second sidewall, the plurality of the active regions being separated from one another by trenches; a side contact configured to be connected to the first sidewall; a cell junction formed at a portion of each active region on the side of the first sidewall to be connected to the side contact; a diffusion barrier region formed at a portion of each active region on the side of the second sidewall; and metal bit lines, each configured to be connected to the side contact and fill a portion of each trench.

In accordance with yet another embodiment of the present invention, a method for fabricating a semiconductor device includes: forming a first conductive layer doped with an impurity for forming a cell junction over a semiconductor substrate; forming a second layer over the first conductive layer; forming a plurality of active regions by etching the second layer and the first conductive layer, the plurality of the active regions being separated from one another by trenches; forming a side contact connected to a sidewall of the first conductive layer of the active region; and forming a plurality of metal bit lines, each connected to the side contacts and filling a portion of each trench.

In accordance with still another embodiment of the present invention, a method for fabricating a semiconductor device includes: forming a first conductive layer doped with a first impurity for forming a cell junction over a semiconductor substrate; forming a second layer over the first conductive layer; forming a plurality of active regions, each having a first sidewall and a second sidewall, by etching the second layer and the first conductive layer, wherein the plurality of the active regions are separated from one another by trenches; ion-implanting a second impurity into a portion of the first conductive layer of the active region on the side of the first sidewall; forming a side contact connected to the first conductive layer of the active region on the side of the second sidewall; and forming a plurality of metal bit lines each connected to the side contact and filling a portion of each trench.

DESCRIPTION OF SPECIFIC EMBODIMENTS

Figure 1:
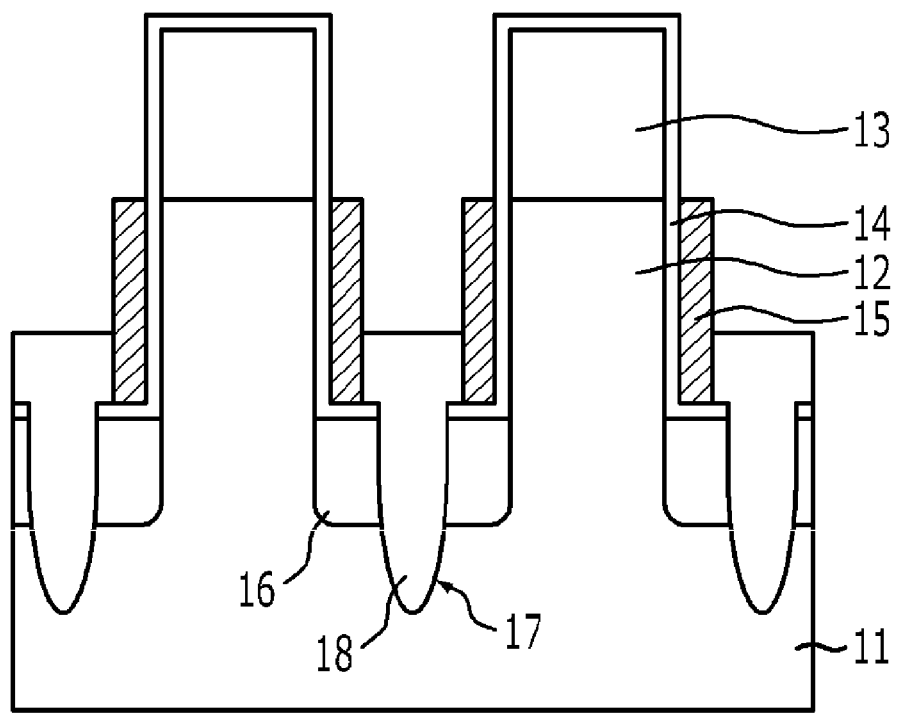
FIG. 1 is a cross-sectional view of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to exemplary embodiments of the present invention, buried bit lines (BBL) buried in a semiconductor substrate under active regions of a pillar structure, are formed of a metal layer. Also, one-side-contacts are formed using a metal silicide for an ohmic-contact between the buried bit lines and the active regions. With the one-side-contacts, a process for forming trenches to separate the buried bit lines from one another is not necessary. Since trench formation is not necessary, high integration may be achieved.

Figure 2:
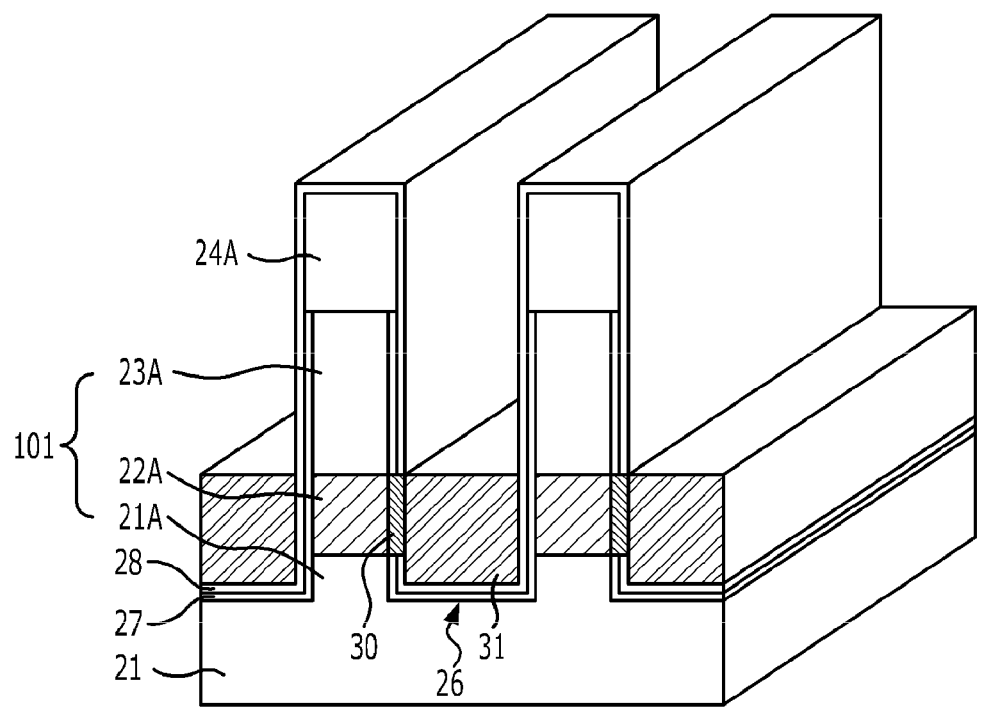
FIG. 2 is a perspective view illustrating a semiconductor device in accordance with a first embodiment of the present invention.

FIG. 2 is a perspective view illustrating a semiconductor device in accordance with a first embodiment of the present invention. Referring to FIG. 2, the semiconductor device in accordance with the first embodiment includes a plurality of active regions 101 each including a stacked structure of a first conductive layer pattern 22A doped with an impurity for a cell junction over a semiconductor substrate 21 and a second layer pattern 23A formed over the first conductive layer pattern 22A, side contacts 30 each connected to a sidewall of the first conductive layer pattern 22A of the active regions 101, and metal bit lines 31 each connected to a side contact 30 and filling a portion of each trench 26 between the plurality of the active regions 101.

The active regions 101 form line-shaped pillars and may each include a substrate protrusion 21A under the first conductive layer pattern 22A. Over the active regions 101, a hard mask layer pattern 24A is formed. The semiconductor substrate 21 includes a silicon substrate doped with a P-type impurity, such as boron. The first conductive layer pattern 22A and the second layer pattern 23A may each include an epitaxial layer. For example, the first conductive layer pattern 22A may be an epitaxial layer doped with an impurity, and the second layer pattern 23A may be an epitaxial layer which is not doped with any impurity. More specifically, the first conductive layer pattern 22A and the second layer pattern 23A may be silicon epitaxial layers. For example, the first conductive layer pattern 22A may be a silicon epitaxial layer doped with an N-type impurity, such as phosphorus(P), while the second layer pattern 23A may be a silicon epitaxial layer which is not doped with any impurity. The first conductive layer pattern 22A has a thickness ranging from approximately 100 Å to approximately 1,500 Å, and the second layer pattern 23A has a thickness ranging from approximately 1,000 Å to approximately 3,000 Å. The concentration of the impurity doping the first conductive layer pattern 22A may be as high as approximately 1E19 atoms/cm$^3$ to approximately 1E22 atoms/cm$^3$.

The side contacts 30 are formed in a line shape on just one sidewall (and not the other sidewall) of the first conductive layer pattern 22A of each active region. Thus, the side contacts 30 are referred to as "one-side-contacts." According to an example, the side contacts 30 may be formed of a metal silicide.

A sidewall oxide layer 27 is formed on the sidewall of the active regions 101 and over the semiconductor substrate 21, and a liner nitride layer 28 is formed over the semiconductor substrate 21 and the sidewall oxide layer 27. In order to form a side contact 30, the liner nitride layer 28 and the sidewall oxide layer 27 are partly removed from a sidewall of an active region 101.

The metal bit lines 31 include a metal layer such as a titanium nitride (TiN) and a tungsten layer (W). For example, the metal bit lines 31 may be formed by stacking a titanium nitride and a tungsten layer (TiN/W). Each metal bit line 31 is connected to the side contact 30 and insulated from a neighboring active region by the sidewall oxide layer 27 and the liner nitride layer 28.

Referring to FIG. 2, since the active regions 101 include the first conductive layer pattern 22A, the active regions 101 provide a cell junction electrically connected to the metal bit lines 31. Since the metal bit lines 31 are formed of a metal layer, resistance is relatively low. Also, since the metal bit lines 31 each constitute a buried structure, they become buried bit lines (BLL). The ohmic-like contact between the metal bit lines 31 and the first conductive layer pattern 22A of each active region 101 is achieved through the side contacts 30 including a metal silicide.

Figure 3A:
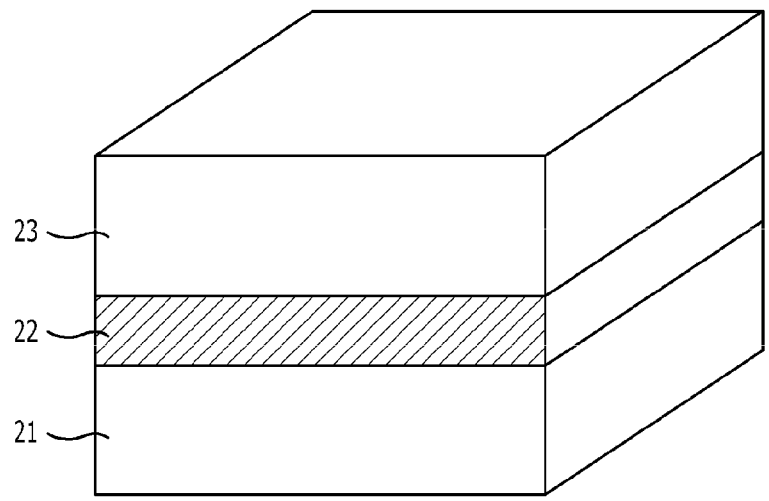
FIGS. 3A to 3F are perspective views illustrating a method for fabricating the semiconductor device shown in FIG. 2.

FIGS. 3A to 3F are perspective views illustrating a method for fabricating the semiconductor device shown in FIG. 2. Referring to FIG. 3A, a first conductive layer 22 doped with an impurity and a second layer 23 which is not doped with an impurity are stacked over the semiconductor substrate 21. The semiconductor substrate 21 includes a silicon substrate doped with a P-type impurity, such as boron.

The first conductive layer 22 and the second layer pattern 23 each include an epitaxial layer. As a result, the first conductive layer 22 is an epitaxial layer doped with an impurity, and the second layer 23 is an epitaxial layer not doped with any impurity. The first conductive layer 22 and the second layer 23 may be silicon epitaxial layers. The first conductive layer 22 may be a silicon epitaxial layer doped with an N-type impurity, such as phosphorus(P), while the second layer 23 may be a silicon epitaxial layer which is not doped with any impurity. The first conductive layer 22 has a thickness ranging from approximately 100 Å to approximately 1,500 Å, and the second layer 23 has a thickness ranging from approximately 1,000 Å to approximately 3,000 Å.

The stacked structure of the first conductive layer 22 and the second layer 23 becomes an active region through a subsequent etch process. In particular, the first conductive layer 22 is a layer that is used to form a cell junction. In order to function as a cell junction, the concentration of the impurity doping the first conductive layer 22 is as high as approximately 1E19 atoms/cm$^3$ to approximately 1E22 atoms/cm$^3$.

Figure 3B:
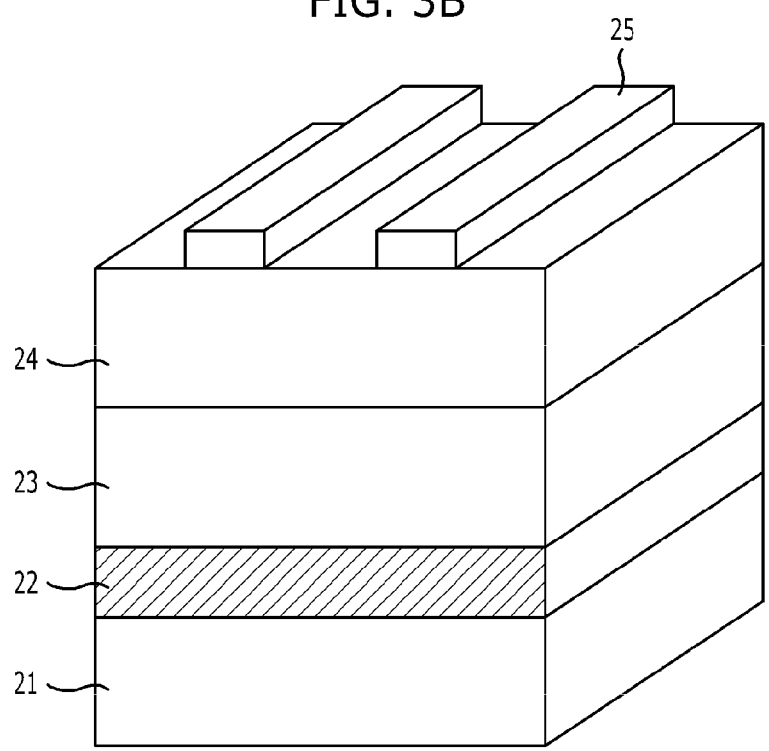

Referring to FIG. 3B, a hard mask layer 24 is formed over the second layer 23. Herein, the hard mask layer 24 may have a multi-layer structure. For example, the hard mask layer 24 may be formed by sequentially stacking a hard mask (HM) nitride layer, a hard mask silicon oxynitride layer (SiON) layer, and a hard mask carbon layer. A pad oxide layer may be formed over the second layer 23 before the hard mask layer 24 is formed.

Subsequently, a first photoresist pattern 25 is formed over the hard mask layer 24. The first photoresist pattern 25 is patterned in a line-space type and is extended in a first direction.

Figure 3C:
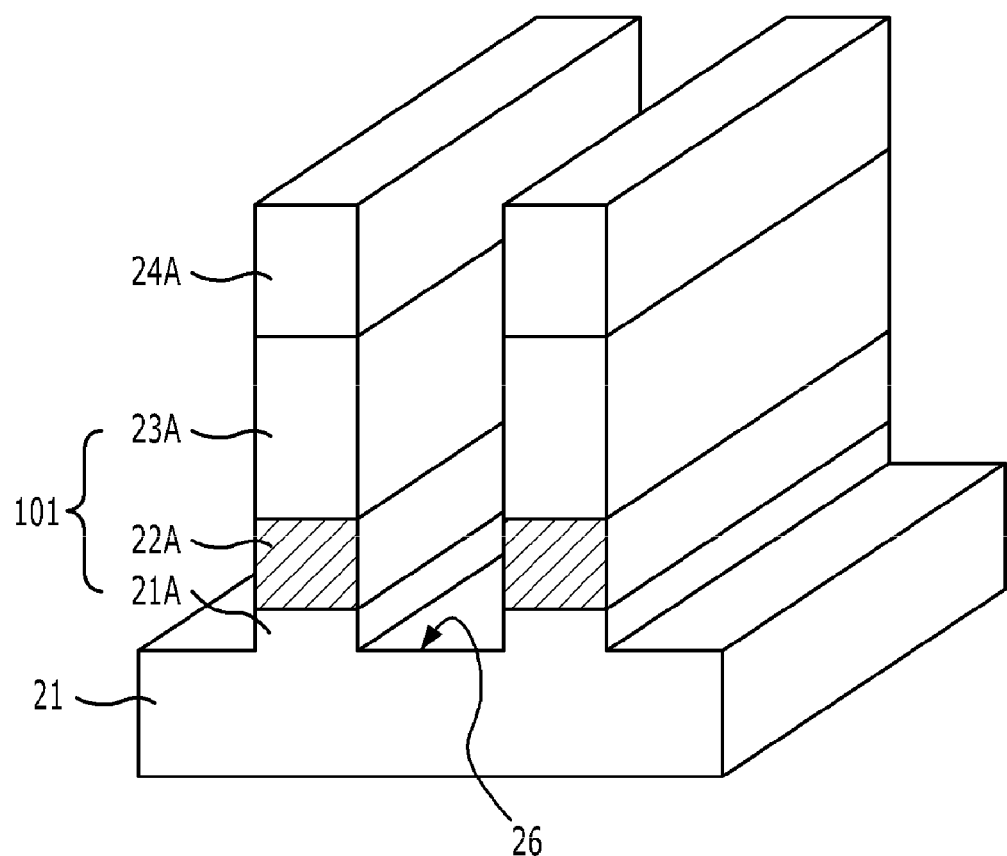

Referring to FIG. 3C, the hard mask layer 24 is etched by using the first photoresist pattern 25 as an etch barrier to thereby form a hard mask layer pattern 24A. Herein, since the hard mask layer pattern 24A has a shape transferred from the shape of the first photoresist pattern 25, the hard mask layer pattern 24A has the line-space shape as well.

Subsequently, the first photoresist pattern 25 is removed by performing a photoresist strip process.

After the removal of the first photoresist pattern 25, the second layer 23 and the first conductive layer 22 are etched using the hard mask layer pattern 24A as an etch barrier, and etching of a portion of the semiconductor substrate 21 is further performed to form a line patterning in the first direction.

As a result, a plurality of active regions 101 forming line-shaped pillars are obtained from the line patterning process performed in the first direction. The active regions 101 include a stacked structure where a first conductive layer pattern 22A and a second layer pattern 23A are stacked therein, and further include a thin substrate protrusion 21A under the first conductive layer pattern 22A.

The hard mask layer pattern 24A remains at least in part after the line patterning process performed in the first direction. Since the active regions 101 are also formed by the hard mask layer pattern 24A whose shape in turn is transferred from the shape of the first photoresist pattern 25, the active regions 101 are patterned in the line-space shape. As a result, trenches 26 are formed between the active regions 101. Since the trenches 26 are formed at where the buried bit lines are to be formed in a subsequent process, the trenches 26 are also referred to as "BBL trenches" as well. Similarly, the line patterning process performed in the first direction is also referred to as a 'BBL trench etch' process.

As a result of the 'BBL trench etch' process, the plurality of the active regions 101 extended in the shape of lines in the first direction are formed over the semiconductor substrate 21 and the hard mask layer pattern 24A remains on the upper portions of the active regions 101.

After the BBL trench etch process is finished, the thickness of the hard mask layer pattern 24A may be decreased. For example, when the hard mask layer pattern 24A has a stacked structure of a hard mask nitride layer, a hard mask silicon oxynitride, and a hard mask carbon layer stacked therein, only the hard mask nitride layer may remain.

Through the BBL trench etch process, a plurality of active regions 101 separated from one another by the trenches 26 are formed. The active regions 101 have a stacked structure of the substrate protrusion 21A, the first conductive layer pattern 22A, and the second layer pattern 23A stacked therein. Since the first conductive layer pattern 22A is doped with an impurity, it constitutes a cell junction, where a cell junction is any reasonably suitable junction between a source region and a drain region of a cell transistor of a memory cell.

Figure 3D:
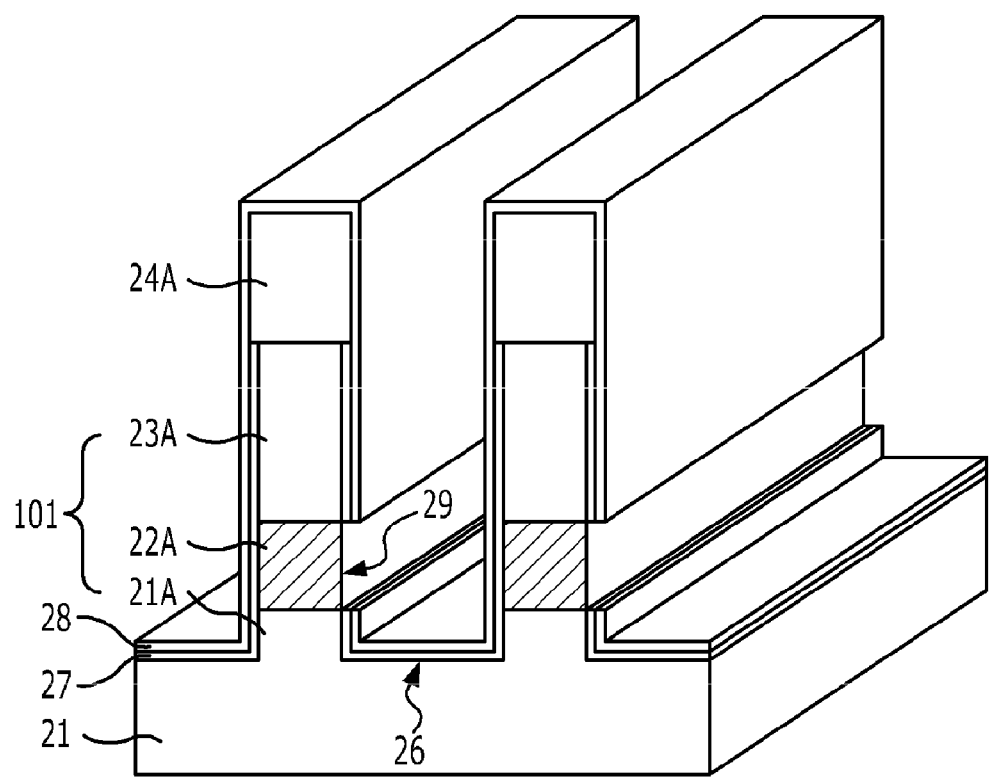

Referring to FIG. 3D, a sidewall oxide layer 27 is formed on the surface of the semiconductor substrate 21 and the active regions 101 through a sidewall oxidation process, according to an exemplary embodiment of the present invention. The sidewall oxidation process for forming the sidewall oxide layer 27 is performed in the atmosphere of oxygen ($O_2$) or oxygen and hydrogen ($O_2/H_2$) at a temperature ranging from approximately 700° C. to approximately 900° C.

Subsequently, a liner nitride layer 28 is deposited over a resultant substrate structure with the sidewall oxide layer 27 formed thereon. The liner nitride layer 28 is formed in the atmosphere of dichlorosilane (DCS) and ammonia ($NH_3$) at a temperature of approximately 600° C. to approximately 800° C. under a pressure of approximately 0.1 Torr to approximately 6 Torr.

Subsequently, contact regions 29 are opened to expose a portion of just one sidewall of each first conductive layer pattern 22A. According to an example, the contact regions 29 have a line shape.

Figure 3E:
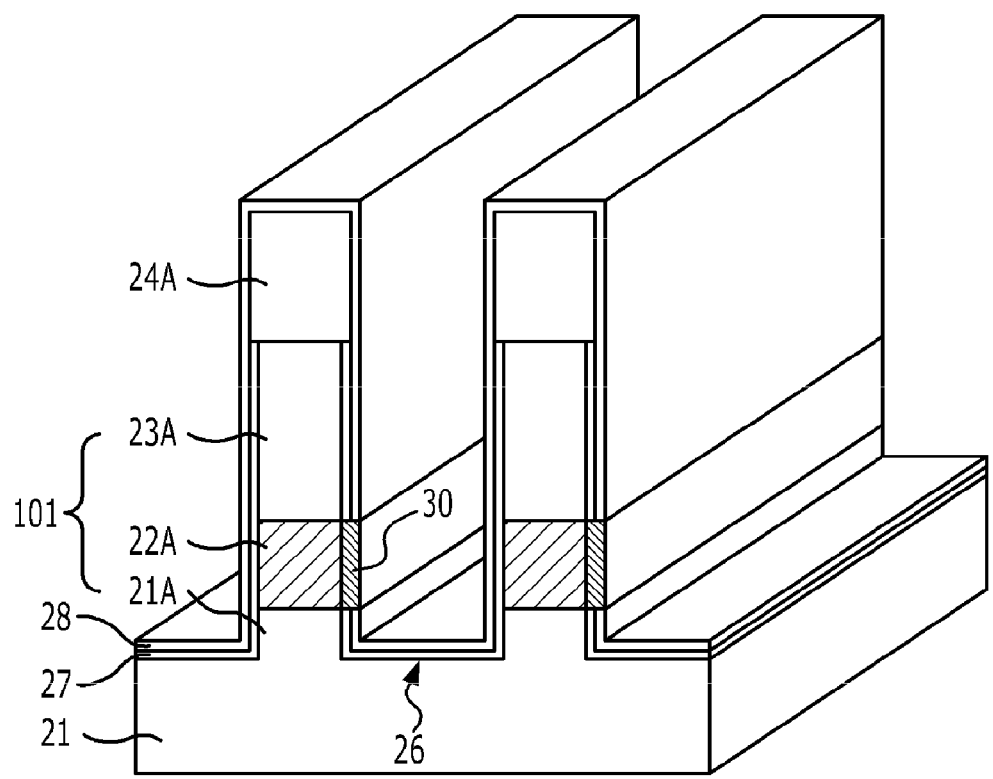

Referring to FIG. 3E, the contact regions 29 are filled in with side contacts 30. The side contacts 30 may include a metal silicide. Examples of the metal silicide include a titanium silicide ($TiSi_2$), a cobalt silicide ($CoSi_2$), a nickel silicide (NiSi) and any other reasonably suitable metal silicide. In order to prevent a deterioration in properties during a subsequent thermal treatment performed at a high temperature, a cobalt silicide ($CoSi_2$) having a high thermal stability may be chosen according to an example.

The cobalt silicide ($CoSi_2$) is formed by performing a thermal treatment after a cobalt layer is deposited over the resultant substrate structure. According to an example, the thermal treatment may be performed at least twice in order to form the cobalt silicide ($CoSi_2$). First, a first rapid thermal annealing (RTA) process is performed at a temperature of approximately 500° C. to thereby form a cobalt silicide of a CoSi phase in the exposed portions of the contact regions 29. Subsequently, a second RTA process is performed at a temperature of approximately 700° C. to thereby transform the CoSi phase into a $CoSi_2$ phase. Subsequently, unreacted cobalt layer is removed. Alternatively, the unreacted cobalt layer may be removed prior to the second RTA process.

According to the embodiment described above, the side contacts 30 have a one-side-contact structure where the side contact is formed only on one sidewall of each active region 101 and the side contacts 30 contact the first conductive layer pattern 22A of the active region 101, which constitutes a cell junction.

Figure 3F:
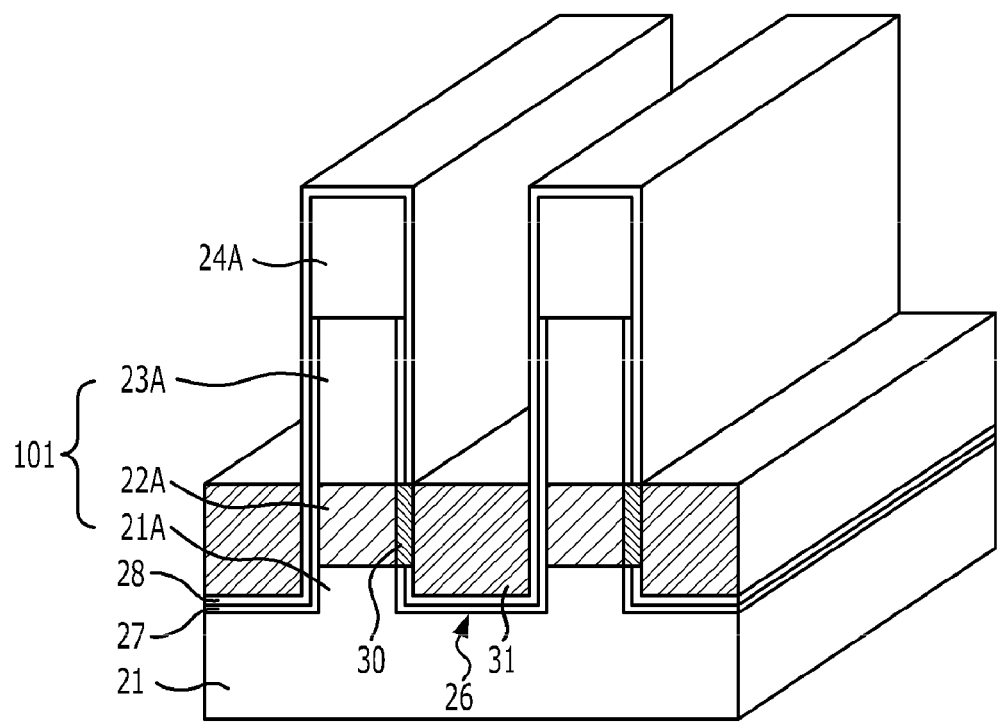

Referring to FIG. 3F, metal bit lines 31 each connected to the side contact 30 are formed to fill a portion of each trench 26 between the neighboring active regions 101.

According to an example, the metal bit lines 31 may be formed as follows. A conductive layer is deposited over the resultant substrate structure with the side contacts 30 formed therein. The conductive layer is deposited to gap-fill the trenches between the active regions 101. The conductive layer includes a metal layer, such as a titanium nitride (TiN) layer and a tungsten (W) layer. For example, the conductive layer may be formed by stacking a titanium nitride layer and a tungsten layer (TiN/W). Subsequently, the conductive layer is removed up to a height sufficient to still contact the side contacts 30. As a result, metal bit lines 31 contacting the side contacts 30 are formed. Herein, the metal bit lines 31 are arranged in parallel to the active regions 101. The active regions 101 and the metal bit lines 31 are electrically connected through the side contacts 30. According to an example, the active regions 101 and the metal bit lines 31 extend in a first direction.

As described above, since the metal bit lines 31 are formed of a metal layer, resistance is relatively low. Also, since each metal bit line 31 fills a portion of each trench 26 between the active regions 101, they constitute buried bit lines. According to an exemplary embodiment of the present invention, a process for forming trenches to separate the buried bit lines one from another is not necessary. For example, although each of the metal bit lines 31 is electrically connected to one of two neighboring active regions 101 through the side contact 30, it is insulated from the other active region 101 by an insulation layer such as the liner nitride layer 28. Therefore, formation of trenches to separate the metal bit lines 31 one from another is not necessary. Therefore, the technology of the embodiments of the present invention is appropriate for high integration for a design rule of under $4F^2$.

Figure 4:
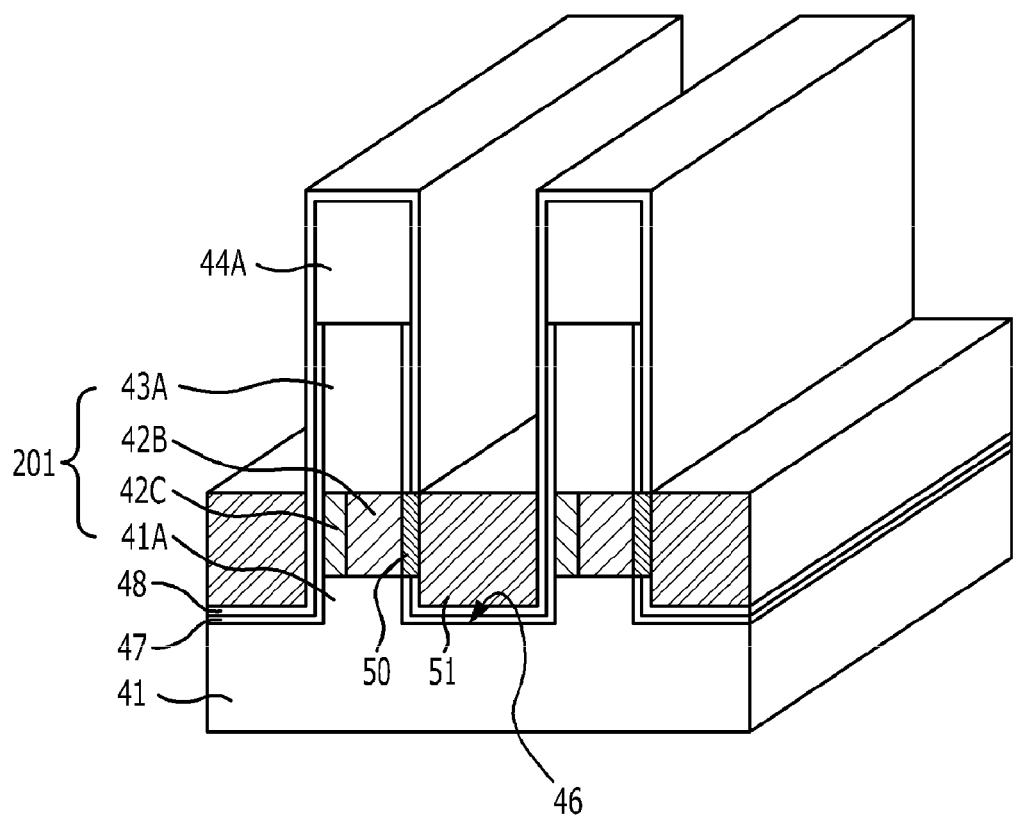
FIG. 4 is a perspective view illustrating a semiconductor device in accordance with a second embodiment of the present invention.

FIG. 4 is a perspective view illustrating a semiconductor device in accordance with a second embodiment of the present invention. Referring to FIG. 4, the semiconductor device fabricated in accordance with the second embodiment includes a plurality of active regions 201 each formed over a semiconductor substrate 41 and including a first sidewall and a second sidewall, side contacts 50 connected to the first sidewalls of the active regions 201, and metal bit lines 51 connected to each side contact 50 and filling a portion of each of trenches between the plurality of active regions 201. Each active region 201 includes a cell junction 42B formed in the active region 201 of the first sidewall and connected to the side contact 50, and a diffusion barrier region 42C formed on the part of the second sidewall of the active region 201 to prevent the cell junction 42B from diffusion.

The active regions 201 form line-shaped pillars, and have a stacked structure of a first conductive layer pattern with the cell junction 42B and the diffusion barrier region 42C formed therein and a second layer pattern 43A formed over the first conductive layer pattern. The active regions 201 may further include a substrate protrusion 41A under the first conductive layer pattern. A hard mask layer pattern 44A is formed in the upper portions of the active regions 201. The semiconductor substrate 41 includes a silicon substrate doped with a P-type impurity, such as boron. The first conductive layer pattern and the second layer pattern 43A each include an epitaxial layer. For example, the first conductive layer pattern may be an epitaxial layer doped with an impurity, and the second layer pattern 43A may be an epitaxial layer not doped with an impurity. More specifically, the first conductive layer pattern and the second layer pattern 43A may be silicon epitaxial layers. For example, the second layer pattern 43A is a silicon epitaxial layer which is not doped with an impurity. The first conductive layer pattern has a thickness ranging from approximately 100 Å to approximately 1,500 Å, and the second layer pattern 43A has a thickness ranging from approximately 1,000 Å to approximately 3,000 Å. The diffusion barrier region 42C formed in the first conductive layer pattern has a conductive impurity counter doped therein, which is different from the impurity doping the cell junction 42B. The cell junction 42B is doped with an N-type impurity such as phosphorus(P), while the diffusion barrier region 42C is doped with a P-type impurity such as boron. The concentrations of the N-type impurity and the P-type impurity may be the same. According to an example, the concentrations of the N-type impurity and the P-type impurity may range from approximately 1E19 to approximately 1E22 atoms/cm$^3$.

The side contacts 50 are formed in a line shape on a sidewall of the cell junction 42B of each active region 201. According to an example, the side contacts 50 include a metal silicide.

A sidewall oxide layer 47 is formed on the sidewall of the active regions 101 and over the semiconductor substrate 41, and a liner nitride layer 48 is formed over the sidewall oxide layer 47. In order to form a side contact 50, the liner nitride layer 48 and the sidewall oxide layer 47 are partly removed from a sidewall of the active region 201.

The metal bit lines 51 include a metal layer such as a titanium nitride (TiN) and a tungsten layer (W). For example, the metal bit lines 51 may be formed by stacking a titanium nitride and a tungsten layer (TiN/W).

FIGS. 5A to 5G are perspective views illustrating a method for fabricating the semiconductor device shown in FIG. 4.

Figure 5A:
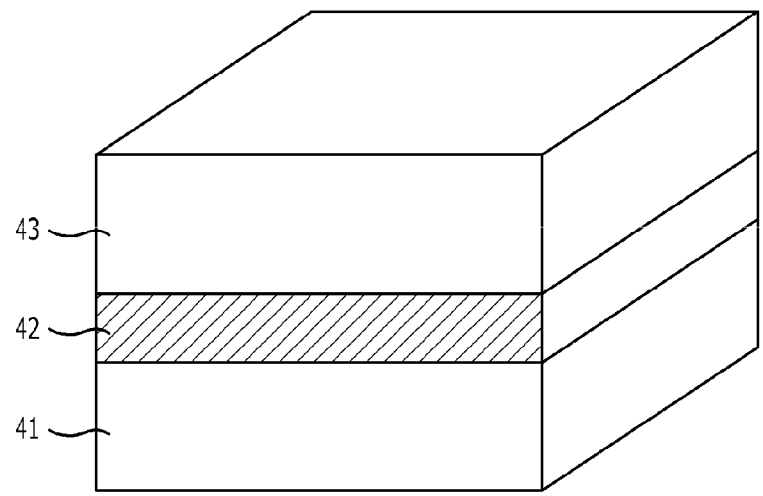
FIGS. 5A to 5G are perspective views illustrating a method for fabricating the semiconductor device shown in FIG. 4.

Referring to FIG. 5A, a first conductive layer 42 doped with an impurity and a second layer 43 which is not doped with an impurity are stacked over the semiconductor substrate 41. The semiconductor substrate 41 includes a silicon substrate doped with a P-type impurity, such as boron.

The first conductive layer 42 and the second layer pattern 43 include an epitaxial layer. As a result, the first conductive layer 42 is an epitaxial layer doped with an impurity, and the second layer 43 is an epitaxial layer which is not doped with an impurity. The first conductive layer 42 and the second layer 43 may be silicon epitaxial layers. The first conductive layer 42 may be a silicon epitaxial layer doped with an N-type impurity, such as phosphorus(P), while the second layer 43 may be a silicon epitaxial layer which is not doped with an impurity. The first conductive layer 42 has a thickness ranging from approximately 100 Å to approximately 1,500 Å, and the second layer 43 has a thickness ranging from approximately 1,000 Å to approximately 5,000 Å.

The stacked structure of the first conductive layer 42 and the second layer 43 becomes an active region through a subsequent etch process. In particular, the first conductive layer 42 is a layer that is used to form a cell junction. In order to function as a cell junction, the concentration of the impurity doping the first conductive layer 42 is as high as approximately 1E19 atoms/cm$^3$ to approximately 1E22 atoms/cm$^3$.

Figure 5B:
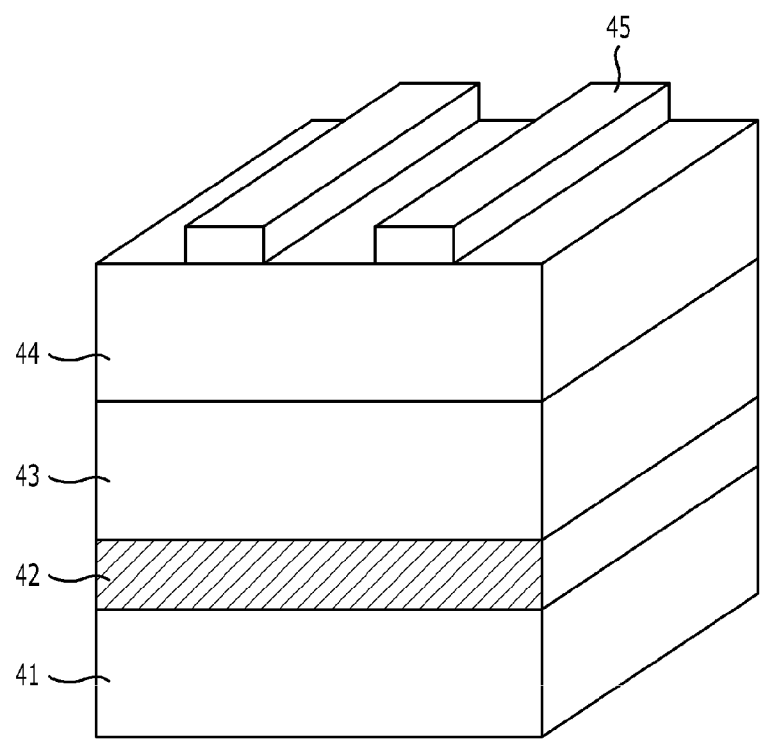

Referring to FIG. 5B, a hard mask layer 44 is formed over the second layer 43. Herein, the hard mask layer 44 may have a multi-layer structure. For example, the hard mask layer 44 may be formed by sequentially stacking a hard mask (HM) nitride layer, a hard mask silicon oxynitride layer (SiON) layer, and a hard mask carbon layer. A pad oxide layer may be formed over the second layer 43 before the hard mask layer 44 is formed.

Subsequently, a first photoresist pattern 45 is formed over the hard mask layer 44. The first photoresist pattern 45 is patterned in a line-space type and extend in a first direction.

Figure 5C:
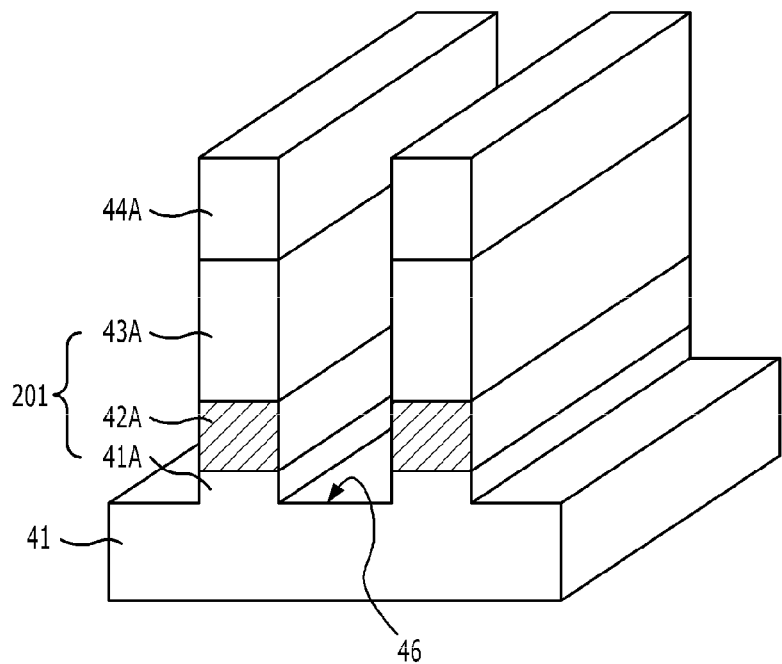

Referring to FIG. 5C, the hard mask layer 44 is etched by using the first photoresist pattern 45 as an etch barrier to thereby form a hard mask layer pattern 44A. Herein, since the hard mask layer pattern 44A has a shape transferred from the shape of the first photoresist pattern 45, the hard mask layer pattern 44A has the line-space shape as well.

Subsequently, the first photoresist pattern 45 is removed by performing a photoresist strip process.

After the removal of the first photoresist pattern 45, the second layer 43 and the first conductive layer 42 are etched using the hard mask layer pattern 44A as an etch barrier, and then a portion of the semiconductor substrate 41 is etched to form a line patterning in the first direction.

As a result, a plurality of active regions 201 forming line-shaped pillars is obtained from the line patterning process performed in the first direction. The active regions 201 include a stacked structure of a first conductive layer pattern 42A and a second layer pattern 43A stacked therein, and further include a thin substrate protrusion 41A under the first conductive layer pattern 42A.

The hard mask layer pattern 44A remains at least in part after the line patterning process performed in the first direction. Since the active regions 201 are also formed by the hard mask layer pattern 44A whose shape in turn is transferred from the shape of the first photoresist pattern 45, the active regions 201 are patterned in the line-space shape. As a result, trenches 46 are formed between the active regions 201. Since the trenches 46 are formed at where the buried bit lines are to be formed in a subsequent process, the trenches 46 are also referred to as "BBL trenches" as well. Similarly, the line patterning process performed in the first direction is also referred to as a 'BBL trench etch' process.

As a result of the 'BBL trench etch' process, the plurality of the active regions 201 extended in the shape of lines in the first direction are formed over the semiconductor substrate 41 and the hard mask layer pattern 44A remains on the upper portions of the active regions 201.

After the BBL trench etch process is finished, the thickness of the hard mask layer pattern 44A may be decreased. For example, when the hard mask layer pattern 44A has a stacked structure of a hard mask nitride layer, a hard mask silicon oxynitride, and a hard mask carbon layer stacked therein, only the hard mask nitride layer may remain.

Through the BBL trench etch process, a plurality of active regions 201 separated from one another by the trenches 46 are formed. The active regions 201 have a stacked structure of the substrate protrusion 41A, the first conductive layer pattern 42A, and the second layer pattern 43A stacked therein. The active regions 201 include a first sidewall and a second sidewall, and the first sidewall is a sidewall that a side contact to be formed subsequently contacts, while the second sidewall is a sidewall onto which a subsequent counter-doping is performed.

Figure 5D:
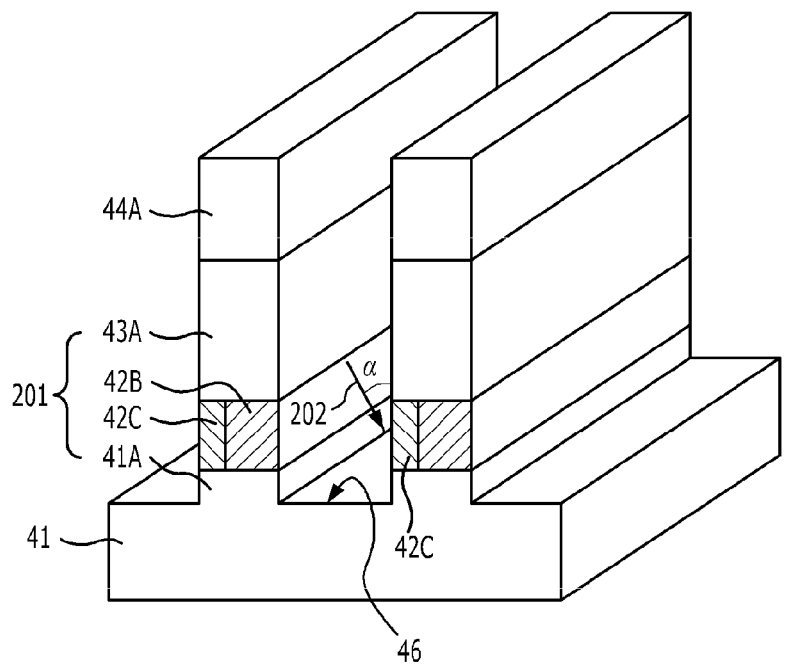

Referring to FIG. 5D, a counter-doping 202 is performed. The counter-doping 202 is performed using a P-type impurity such as boron (B) or boron difluoride ($BF_2$). Doping energy ranges from approximately 0.1 keV to approximately 5 keV, and a dose is the same as the concentration of the impurity doping the first conductive layer pattern 42A. For example, since the concentration of the impurity doping the first conductive layer pattern 42A ranges from approximately 1E19 atoms/$cm^3$ to approximately 1E22 atoms/$cm^3$, the counter-doping 202 is performed using a P-type impurity ranging from approximately 1E19 atoms/$cm^3$ to approximately 1E22 atoms/$cm^3$. The counter-doping 202 uses a tilt ion implantation process performed at a certain angle α to the second sidewall of the first conductive layer pattern 42A. During the tilt ion implantation, a shadow effect occurs by the hard mask layer pattern 44A and accordingly, the first sidewall in opposite to the second sidewall onto which the counter-doping is performed is not doped.

The counter-doping prevents a floating body effect. For example, when the first conductive layer pattern 42A functions as a cell junction, the counter-doping 202 is performed in advance onto a sidewall of the first conductive layer pattern 42A opposite to the sidewall of the first conductive layer pattern 42A contacting a subsequently formed side contact so as to prevent the floating body effect caused by excessive diffusion of the impurity doping the first conductive layer pattern 42A.

The counter-doping 202 forms the diffusion barrier region 42C in a portion of the first conductive layer pattern 42A, and the other portion of the first conductive layer pattern 42A which is not counter-doped becomes the cell junction 42B.

Figure 5E:
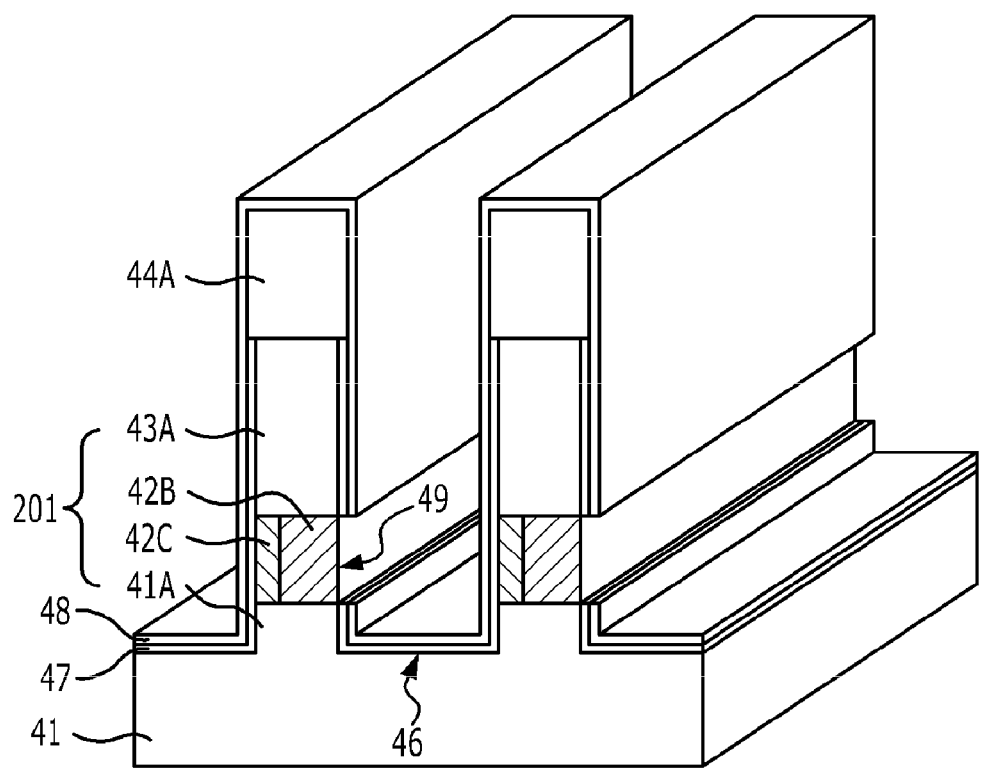

Referring to FIG. 5E, a sidewall oxide layer 47 is formed on the surface of the semiconductor substrate 41 and the active regions 201 through a sidewall oxidation process, according to an exemplary embodiment of the present invention. The sidewall oxidation process for forming the sidewall oxide layer 47 is performed in the atmosphere of oxygen ($O_2$) or oxygen and hydrogen ($O_2/H_2$) at a temperature ranging from approximately 700° C. to approximately 900° C.

Subsequently, a liner nitride layer 48 is deposited over a resultant substrate structure with the sidewall oxide layer 47 formed thereon. The liner nitride layer 48 is formed in the atmosphere of dichlorosilane (DCS) and ammonia ($NH_3$) at a temperature of approximately 600° C. to approximately 800° C. under a pressure of approximately 0.1 Torr to approximately 6 Torr.

Subsequently, contact regions 49 are opened to expose the cell junction 42B. The process for opening the contact regions 49 is described below.

Figure 5F:
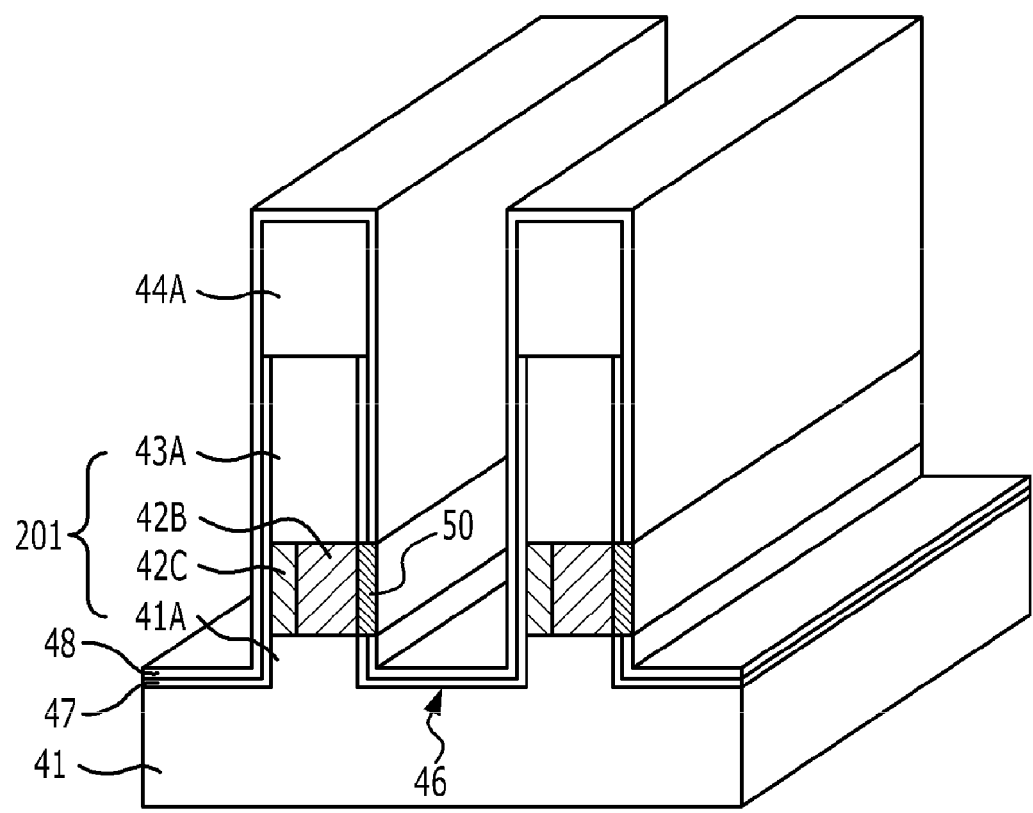

Referring to FIG. 5F, the contact regions 49 are filled in with side contacts 50. The side contacts 50 may include a metal silicide. Examples of the metal silicide include a titanium silicide ($TiSi_2$), a cobalt silicide ($CoSi_2$), a nickel silicide (NiSi) and any other reasonably suitable metal silicide. In order to prevent a deterioration in properties during a subsequent thermal treatment performed at a high temperature, a cobalt silicide ($CoSi_2$) having a high thermal stability may be chosen according to an example.

The cobalt silicide ($CoSi_2$) is formed by performing a thermal treatment after a cobalt layer is deposited over the resultant substrate structure. According to an example, the thermal treatment may be performed at least twice in order to form the cobalt silicide ($CoSi_2$). First, a first rapid thermal annealing (RTA) process is performed at a temperature of approximately 500° C. to thereby form a cobalt silicide of a CoSi phase in the exposed portions of the contact regions 49. Subsequently, a second RTA process is performed at a temperature of approximately 700° C. to thereby transform the CoSi phase into a $CoSi_2$ phase. Subsequently, unreacted cobalt layer is removed. Alternatively, the unreacted cobalt layer may be removed prior to the second RTA process.

According to the embodiment described above, the side contacts 50 have a one-side-contact structure where the side contact is formed only on one sidewall of each active region 101 and the side contacts 30 contact the cell junction 42B.

Figure 5G:
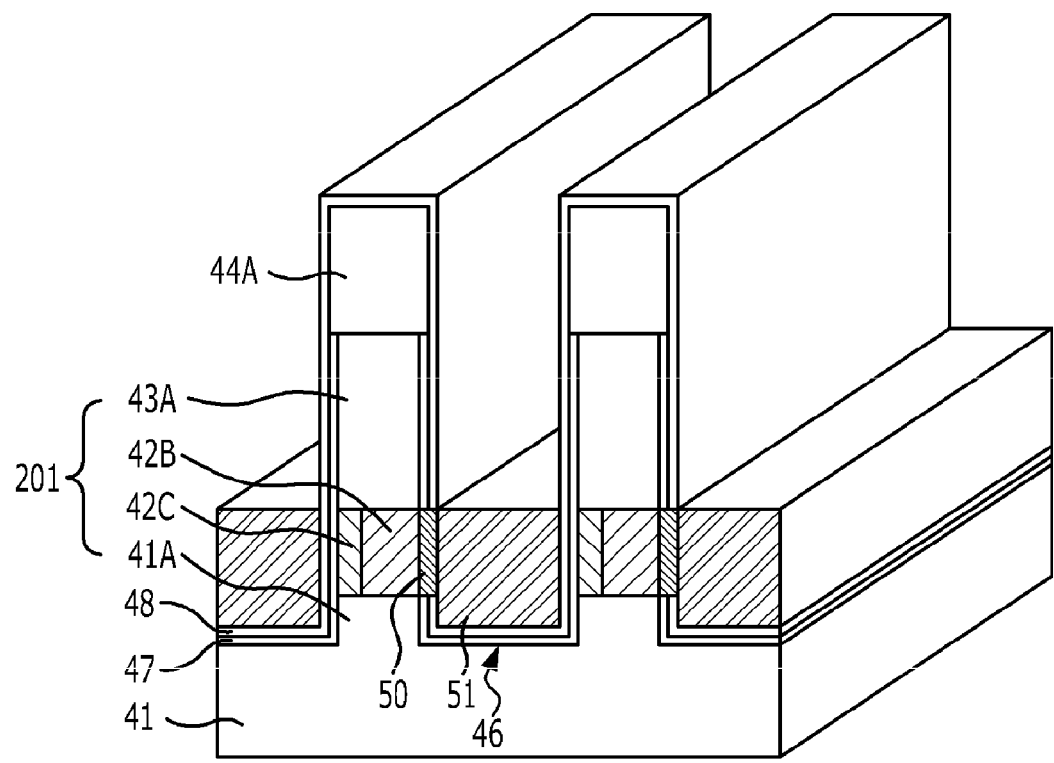

Referring to FIG. 5G, metal bit lines 51 each connected to the side contact 50 are formed to fill a portion of each trench 46 between the neighboring active regions 201.

According to an example, the metal bit lines 51 are formed as follows. A conductive layer is deposited over the resultant substrate structure with the side contacts 50 formed therein. The conductive layer is deposited to gap-fill the trenches between the active regions 201. The conductive layer includes a metal layer, such as a titanium nitride (TiN) layer and a tungsten (W) layer. For example, the conductive layer may be formed by stacking a titanium nitride layer and a tungsten layer (TiN/W). Subsequently, the conductive layer is removed up to a height sufficient to still contact the side contacts 50. As a result, the metal bit lines 51 contacting the side contacts 50 are formed. Herein, the metal bit lines 51 are arranged in parallel to the active regions 201. The active regions 201 and the metal bit lines 51 are electrically connected through the side contacts 50. According to an example, the active regions 201 and the metal bit lines 51 extend in a first direction.

As described above, since the metal bit lines 51 are formed of a metal layer, resistance is relatively low. Also, since each metal bit line 51 fills a portion of each trench 46 between the active regions 201, they constitute buried bit lines. According to an exemplary embodiment of the present invention, a process for forming trenches to separate the buried bit lines one from another is not necessary. For example, although each of the metal bit lines 51 is electrically connected to one active region 201 of two neighboring active regions 201 through the side contact 50, it is insulated from the other active region 201 by an insulation layer such as the liner nitride layer 48. Therefore, it does not have to form the trenches 46 to separate the metal bit lines 51 one from another. Therefore, the technology of the embodiments of the present invention is appropriate for high integration for a design rule of under $4F^2$.

According to the first and second embodiments of the present invention, the first conductive layer doped with an impurity may function as the cell junction 42B of the active regions 201.

When the first conductive layer doped with an impurity is used instead of using a conventional ion implantation method, it is possible to form the cell junction 42B at a desired position and easily control the concentration and junction depth of the cell junction 42B.

FIGS. 6A to 6I perspective views illustrating a method for forming contact regions in accordance with the second embodiment of the present invention. The description will be made with respect to processes subsequent to the formation of the cell junction and the diffusion barrier region.

Figure 6A:
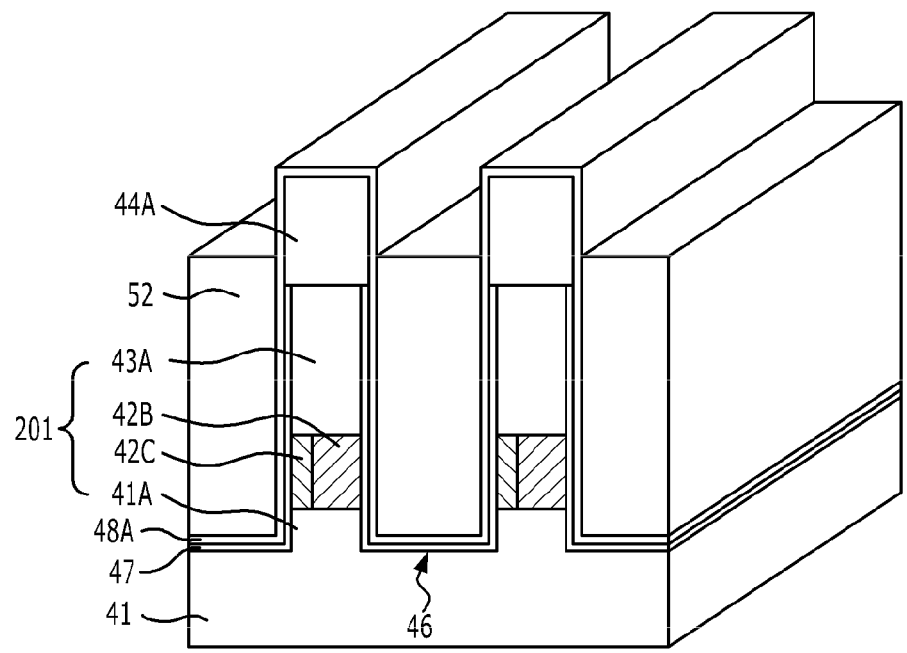
FIGS. 6A to 6I perspective views illustrating a method for forming contact regions in accordance with the second embodiment of the present invention.

Referring to FIG. 6A, after the cell junction 42B and the diffusion barrier region 42C are formed, a sidewall oxide layer 47 is formed on the surface of the active regions and the semiconductor substrate 41 through a wall oxidation process. The sidewall oxidation process for forming the sidewall oxide layer 47 is performed in the atmosphere of oxygen ($O_2$) or oxygen and hydrogen ($O_2/H_2$) at a temperature ranging from approximately 700° C. to approximately 900° C.

Subsequently, a liner nitride layer 48A is deposited over a resultant substrate structure with the sidewall oxide layer 47 formed thereon. The liner nitride layer 48A is formed in the atmosphere of dichlorosilane (DCS) and ammonia ($NH_3$) at a temperature of approximately 600° C. to approximately 800° C. under a pressure of approximately 0.1 Torr to approximately 6 Torr.

Subsequently, a first sacrificial layer 52 is formed over the liner nitride layer 48A to gap-fill trenches positioned between the active regions 201. Herein, the first sacrificial layer 52 is a material to be removed after a subsequent process. The first sacrificial layer 52 may include an amorphous silicon layer. The amorphous silicon layer is deposited in the atmosphere of silane ($SiH_4$) at a temperature of approximately 400° C. to approximately 600° C. under a pressure of approximately 0.3 Torr to approximately 2 Torr.

Subsequently, the first sacrificial layer 52 is planarized through a chemical mechanical polishing (CMP) method until a surface of the hard mask layer pattern 44A is exposed. After the planarization, an etch-back process is further performed in such a manner that the first sacrificial layer 52 remains with a certain height. The first sacrificial layer 52 may be higher than the contact surface between the hard mask layer pattern 44A and the second layer pattern 43A.

As described above, when the first sacrificial layer 52 is formed by performing the etch-back process, the hard mask layer pattern 44A forms a protrusion.

Figure 6B:
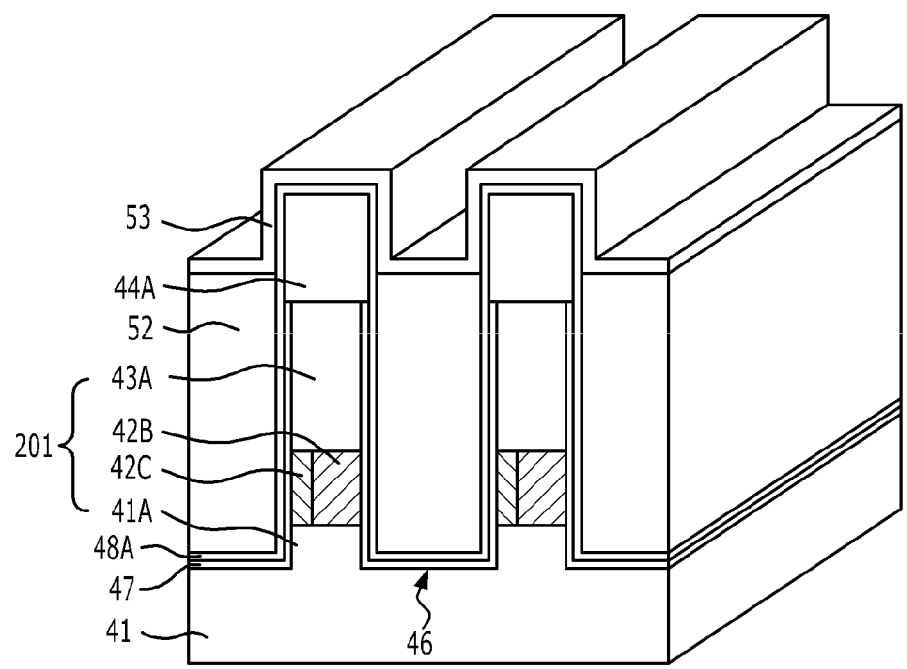

Referring to FIG. 6B, an etch barrier layer 53 is formed. The etch barrier layer 53 may be a polysilicon layer which is not doped with an impurity.

Figure 6C:
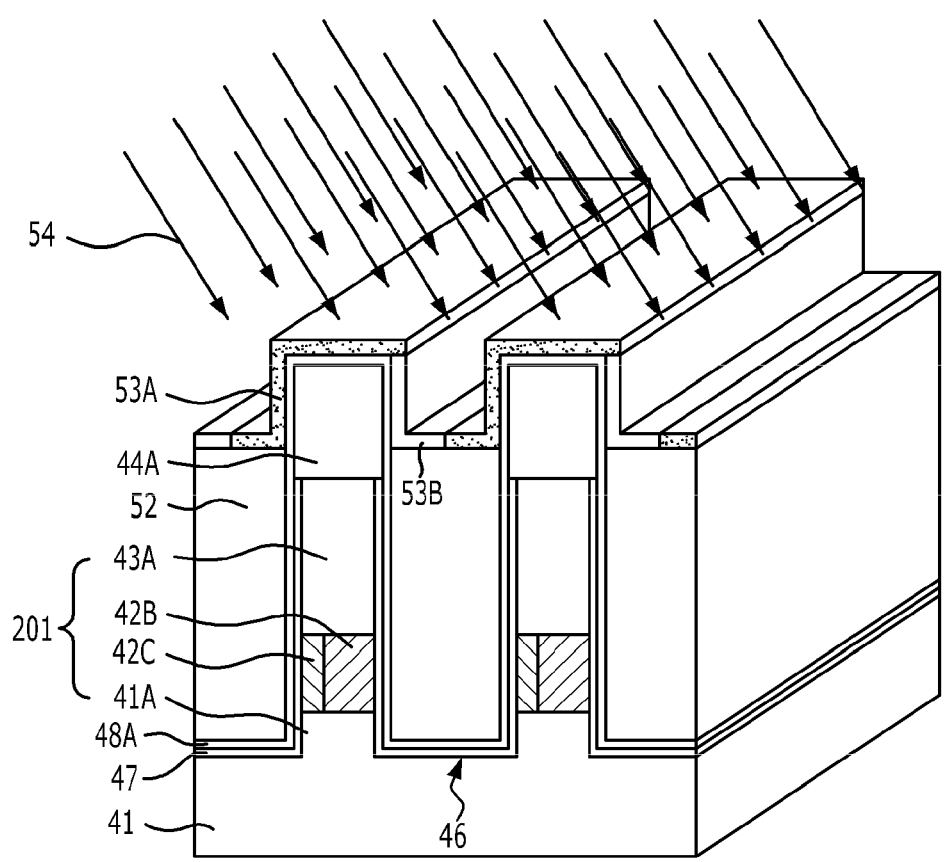

Referring to FIG. 6C, a tilt ion implantation process 54 is performed at a certain angle to implant ions of a dopant at a tilt. As a result, the dopant is implanted into a portion of the etch barrier layer 53.

The tilt ion implantation process 54 is performed at a certain angle with respect to the surface of a semiconductor substrate. The certain angle ranges from approximately 5 degrees to approximately 30 degrees. Some ion beams are shadowed by the protrusion of the hard mask layer pattern 44A. As a result, portion 53A of the etch barrier layer is doped while the other portion 53B of the etch barrier layer remains undoped. The dopant that is being ion-implanted may be a P-type dopant, e.g., boron, and a dopant source for ion-implanting boron may be $BF_2$. As a result, the portion 53B of the etch barrier layer remains undoped and contacts the right part of the hard mask layer pattern 44A.

As described above, the portion of the etch barrier layer 53 formed on the upper surface of the hard mask layer pattern 44A and a portion contacting the left part of the hard mask layer pattern 44A become a dopant-doped etch barrier layer 53A through the tilt ion implantation process 54 of the dopant. The other portion where the dopant is not implanted becomes an undoped etch barrier layer 53B.

Figure 6D:
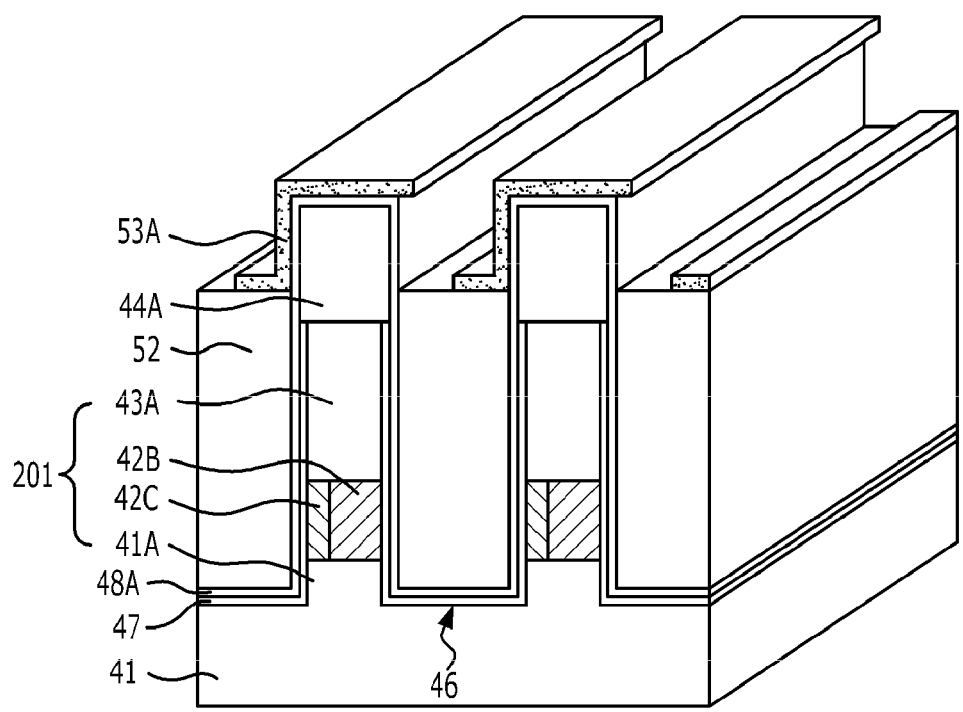

Referring to FIG. 6D, the undoped etch barrier layer 53B is removed through a wet etching. Herein, the polysilicon layer used as the first sacrificial layer 52 has different etch rate depending on whether it is doped with the dopant or not. In particular, undoped polysilicon has a fast wet etch process. Therefore, the undoped polysilicon is selectively removed using a chemical having a high selectivity so that only the undoped polysilicon layer is wet-etched.

When the undoped etch barrier layer is removed, only the dopant-doped etch barrier layer 53A remains.

Figure 6E:
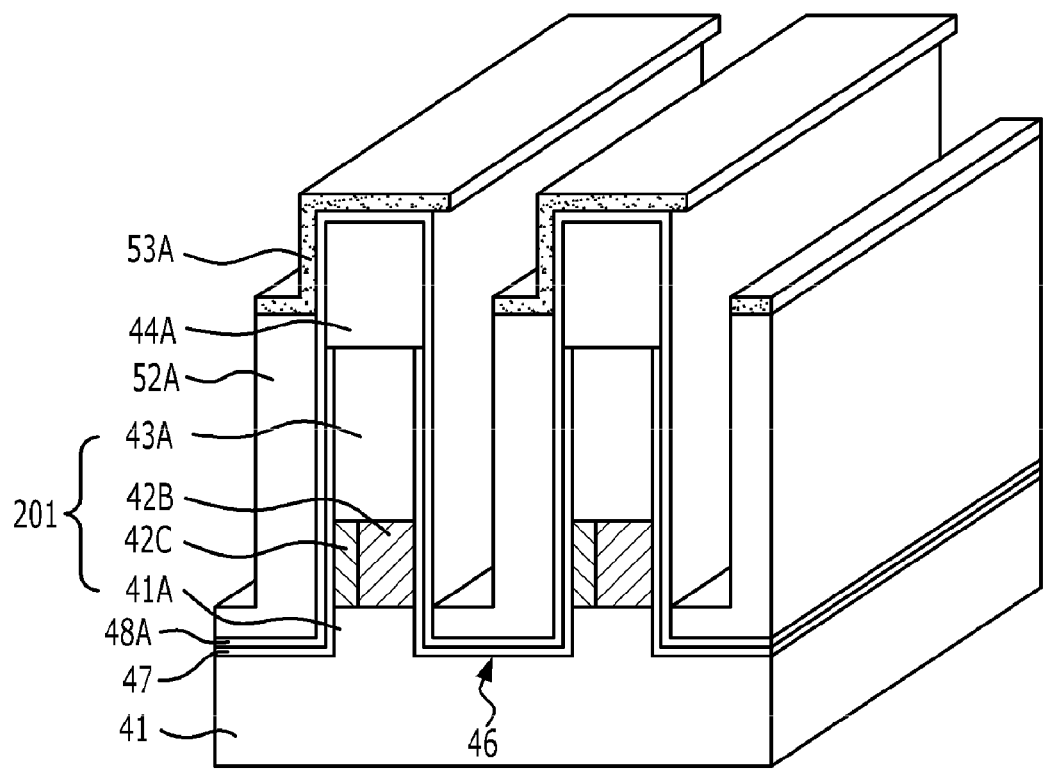

Referring to FIG. 6E, a portion of the first sacrificial layer 52 is etched using the dopant-doped etch barrier layer 53A as an etch barrier. As a result, a portion of the first sacrificial layer 52 adjacent to one sidewall of the active region 201 is deeply etched. The etched first sacrificial layer is marked with a reference numeral 52A and referred to as "a first sacrificial layer pattern 52A" hereafter. The first sacrificial layer 52 is etched up to a position sufficient to create a space where a side contact is to be formed subsequently.

Figure 6F:
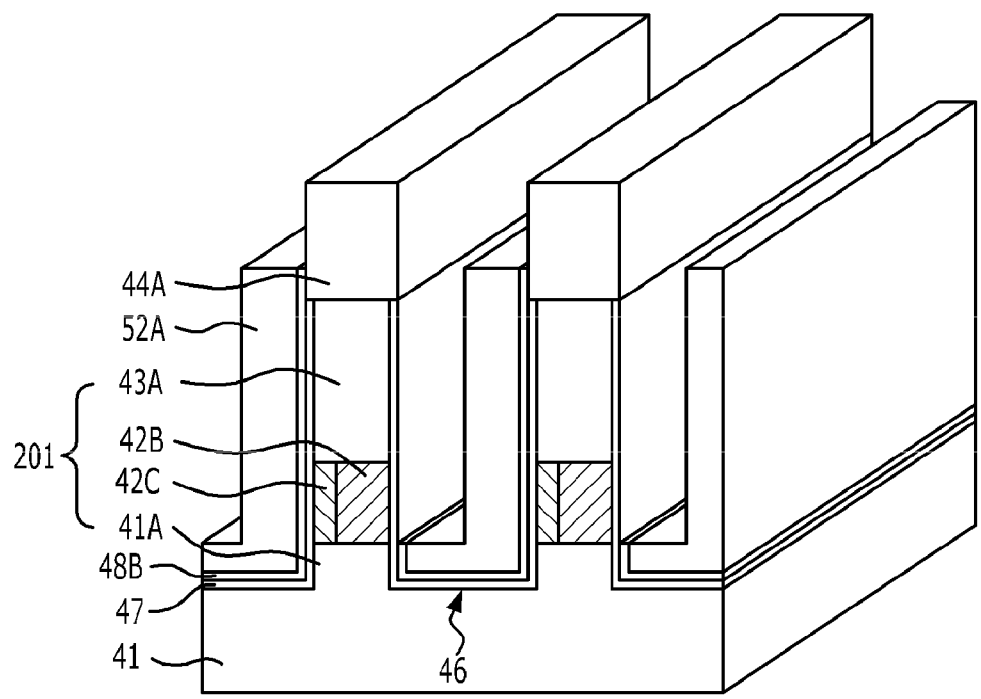

Referring to FIG. 6F, the dopant-doped etch barrier layer 53A is removed. After the removal of the dopant-doped etch barrier layer 53A, the first liner nitride layer 48A is removed through an etching process. As a result, both sidewalls and upper surface of the hard mask layer pattern 44A on the protrusion of the hard mask layer pattern 44A are removed. The first sacrificial layer pattern remains only in an area where it is shielded by and contacts the first sacrificial layer pattern 52A. The remaining first sacrificial layer pattern is marked with a reference numeral 48B and referred to as "a first liner nitride layer pattern 48B" hereafter. In removing the first liner nitride layer 48A, a wet cleaning process may be performed or a dry etching process having a selectivity with respect to an oxide layer may be performed in order to protect the sidewall oxide layer 47 on the sidewalls of the active regions 201.

Figure 6G:
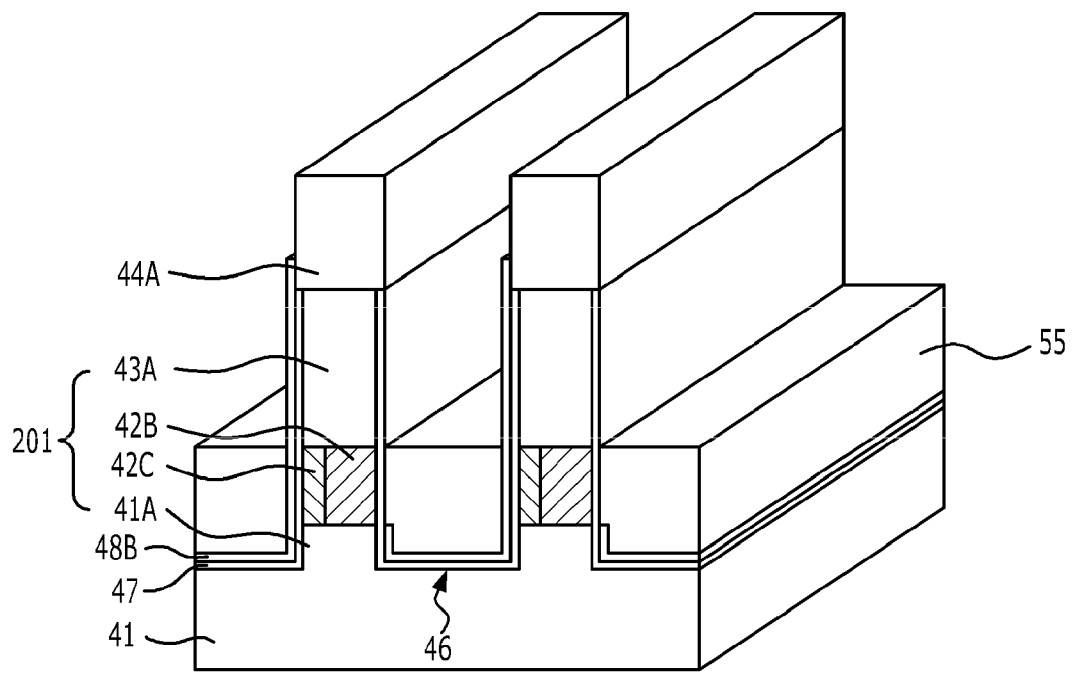

Referring to FIG. 6G, after all the remaining first sacrificial layer pattern 52A is removed, the resultant substrate structure is gap-filled with a second sacrificial layer 55. The second sacrificial layer 55 may include an amorphous silicon layer.

Subsequently, the second sacrificial layer 55 is planarized until the surface of the hard mask layer pattern 44A is exposed by performing a chemical mechanical polishing process, and then an etch-back process is performed to have the second sacrificial layer 55 remain with a certain height. As a result, the second sacrificial layer 55 remains with the certain height and the height of the remaining second sacrificial layer 55 limits the space where the side contact is to be formed in a subsequent process.

Figure 6H:
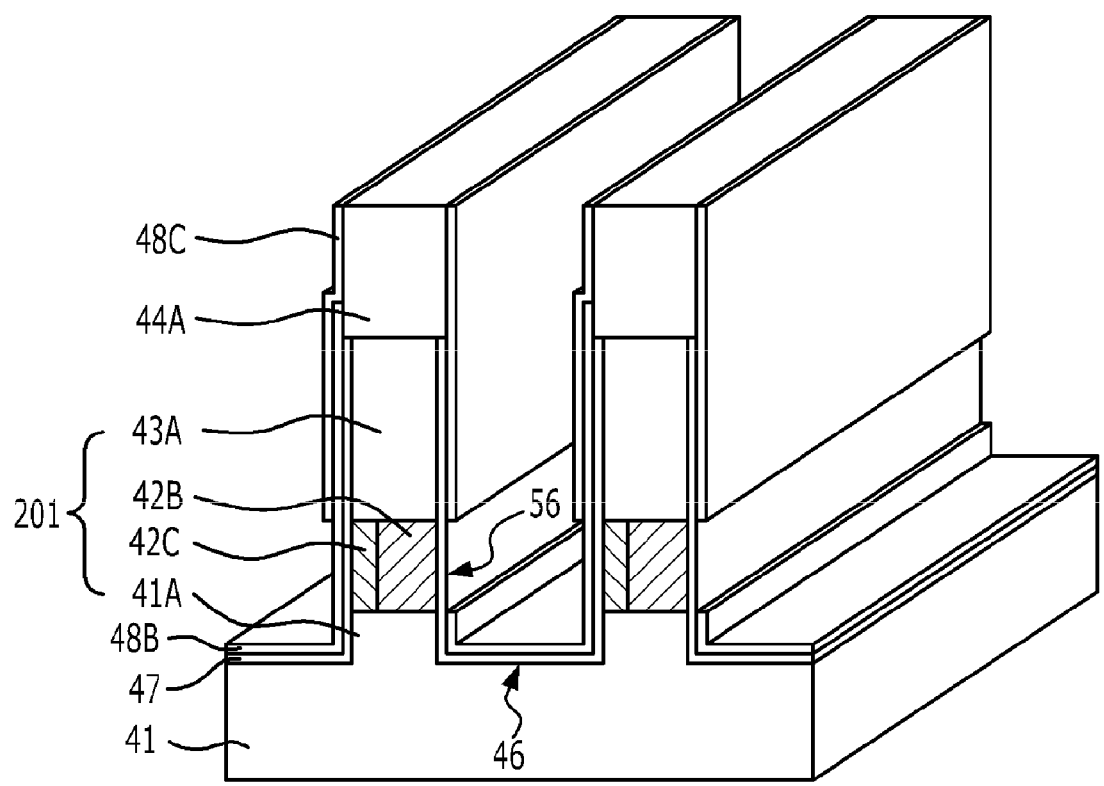

Referring to FIG. 6H, a second liner nitride layer 48C is formed over the resultant substrate structure and a selective etch process is performed to expose the surface of the second sacrificial layer 55. As a result, a double insulation layer structure of the sidewall oxide layer 47 and the second liner nitride layer 48C is formed on the sidewalk of the active regions 201. In the regions where the side contacts are to be formed, only the sidewall oxide layer 47 exists on the active region 201. On the sidewalls of the hard mask layer pattern 44A, a single insulation layer structure of the second liner nitride layer 48C is formed. The second liner nitride layer 48C is formed in the atmosphere of dichlorosilane (DCS) at a temperature ranging from approximately 600° C. to approximately 800° C. and under a pressure ranging from approximately 0.1 Torr to approximately 6 Torr.

When the second sacrificial layer 55 is removed by etching, a line-type opening 56 is formed on one side of each active region 201.

Herein, the line-type opening 56 is a space from which the second liner nitride layer 48C between the first liner nitride layer pattern 48B and the second liner nitride layer 48C is removed, and the linewidth of the line-type opening 56 may be the same as the height of the cell junction 42B.

Figure 6I:
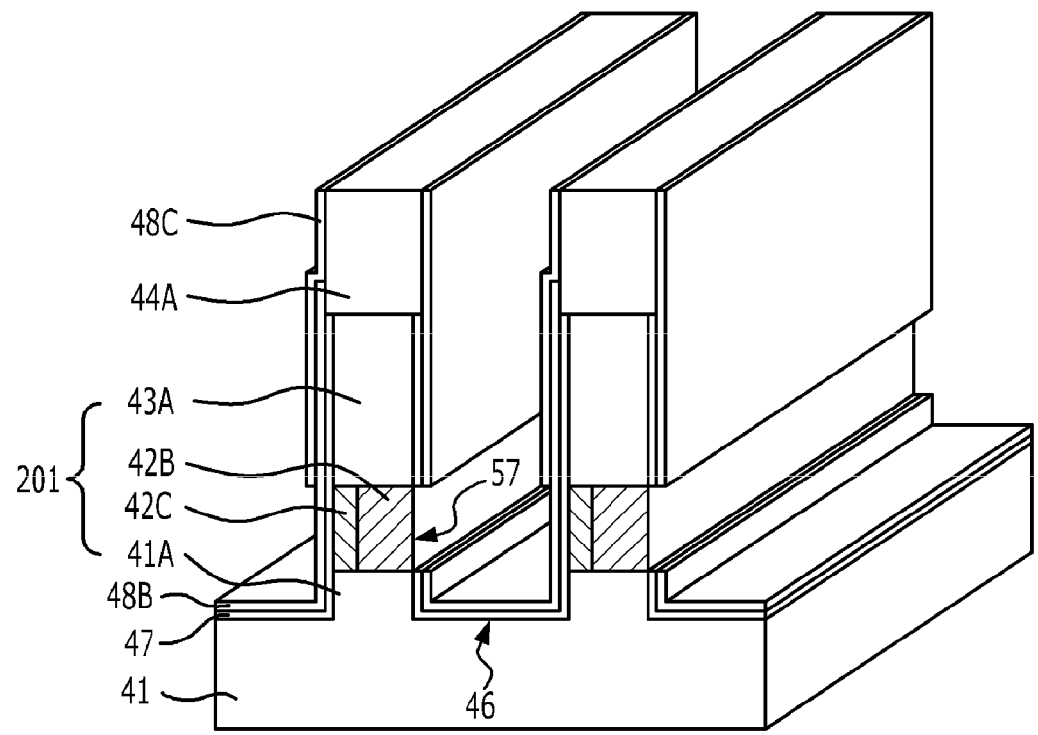

Referring to FIG. 6I, the sidewall oxide layer 47 exposed through the line-type opening 56 is selectively removed. As a result, a contact region 57 exposing a sidewall of the active region 201, that is, a sidewall of the cell junction 42B, in a line shape is formed. The sidewall oxide layer 47 may be removed through an etching process in order to form the contact region 57. For example, when a wet etching process is performed using HF or buffered oxide etchant (BOE), the sidewall oxide layer 47 may be selectively removed without damaging the neighboring liner nitride layers. The contact region 57 corresponds to the contact region 49 shown in FIG. 5E.

COMPARATIVE EXAMPLE

Figure 7:
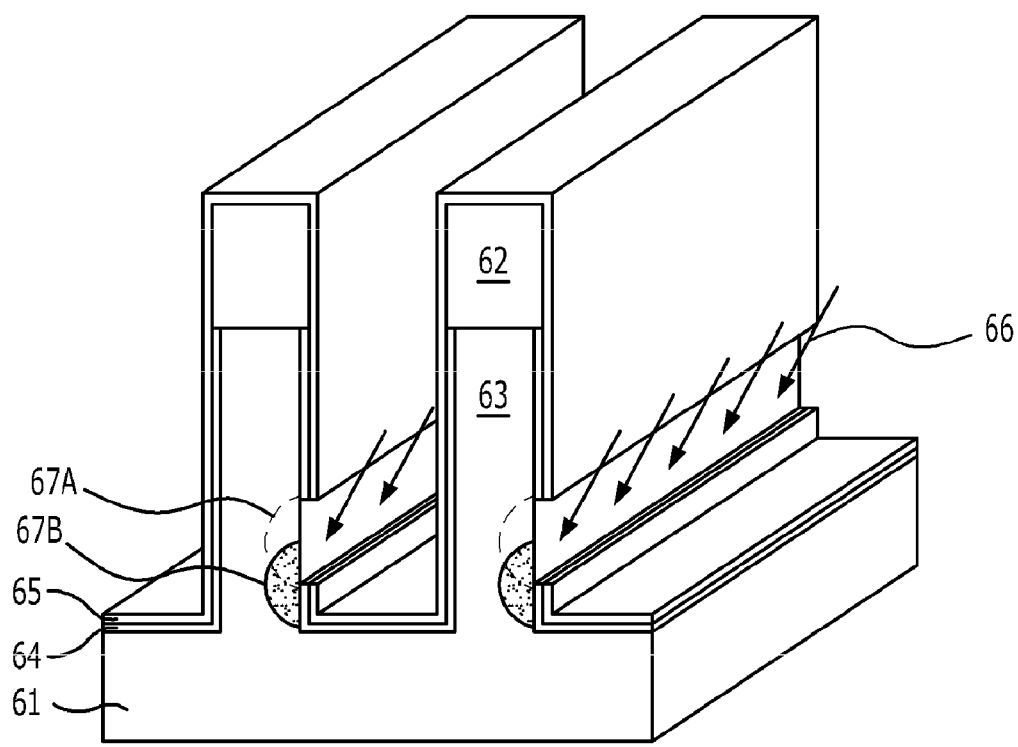
FIG. 7 is a perspective view illustrating a method for forming a cell junction through an ion implantation process.

FIG. 7 is a perspective view illustrating a method for forming a cell junction through an ion implantation process. Referring to FIG. 7, a plurality of active regions 63 are formed by etching a semiconductor substrate 61 to a certain depth by using a hard mask layer 62. Subsequently, a sidewall oxide layer 64 is formed through a sidewall oxidation process and then a liner nitride layer 65 covering the active regions 63 is formed. A contact region is opened to expose a sidewall of each active region 63 and an ion implantation process 66 is performed to form a cell junction 67A. Herein, the ion implantation process 66 may be a tilt ion implantation process to form the cell junction 67A only on one sidewall of the active region 63.

Referring to FIG. 7, the tilt ion implantation process is performed to form the cell junction 67A on just one sidewall of the active region 63. Since the cell junction 67A is formed on just one sidewall of each active region 63 through the tilt ion implantation process, a shadow effect occurs during the tilt ion implantation process and thus the cell junction 67A is not formed in a desired position.

Thus, the cell junction 67A may be formed at a lower position than a desired position due to the shadow effect caused by the neighboring active regions 63 and the hard mask layer 62 during the tilt ion implantation.

Also, since the active regions 63 are relatively high and the space between the active regions 63 is relatively narrow, it is difficult to form the cell junction 67A at the correct position through a tilt ion implantation process.

To sum up, the cell junction 67A may be formed through the tilt ion implantation process according to the above-described comparative example, but the cell junction 67A may not be formed at a desired position. Therefore, according to an exemplary embodiment of the present invention, the cell junction 67A is not formed by using the tilt ion implantation process but by using a conductive layer doped with an impurity in forming the cell junction 67A.

According to the exemplary embodiments of the present invention, a semiconductor device does not have deterioration of operation characteristics by having decreased resistance of the semiconductor device from forming buried bit lines of a metal layer. Thus, miniaturization of the semiconductor device may be achieved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first conductive layer doped with an impurity for forming a cell junction over a semiconductor substrate;
    forming a second layer over the first conductive layer;
    forming a plurality of active regions by etching the second layer and the first conductive layer to separate the plurality of active regions from one another by trenches;
    forming a side contact connected to a sidewall of the first conductive layer for each of the active regions; and
    forming a plurality of metal bit lines that are each connected to a respective one of the side contacts and fill a portion of a respective one of the trenches,
    wherein the first conductive layer and the second layer each comprise a silicon epitaxial layer.

2. The method of claim 1, wherein the second layer comprises an undoped layer.

3. The method of claim 1, wherein the first conductive layer is doped with an N-type conductive impurity.

4. The method of claim 1, wherein the impurity doping of the first conductive layer has a doping concentration ranging from approximately $1E19$ atoms/cm$^3$ to approximately $1E22$ atoms/cm$^3$.

5. The method of claim 1, wherein the forming of the side contact connected to a sidewall of the first conductive layer comprises:
    forming an insulation layer covering the active regions;
    forming a contact region exposing a sidewall of the first conductive layer; and
    filling the contact region with the side contact.

6. The method of claim 5, wherein the contact region is formed by etching the insulation layer to divide the insulation layer into two regions separated by the contact region.

7. The method of claim 5, further comprising forming a hard mask layer over the second layer and etching the hard mask layer.

8. The method of claim 7, wherein the forming of the insulation layer includes forming the insulation layer over the first conductive layer, the second layer, and the hard mask layer.

9. The method of claim 8, wherein the insulation layer includes an insulation layer formed over the first conductive layer and the second layer but not over the hard mask layer and another insulation layer formed over the first conductive layer, the second layer, and the hard mask layer.

* * * * *